United States Patent
Tokiwa (10) Patent No.: US 7,527,863 B2
(45) Date of Patent: *May 5, 2009

(54) FUNCTIONALIZED POLYPHENYLENE ETHER

(75) Inventor: Tetsuji Tokiwa, Sodegaura (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/017,915

(22) Filed: Jan. 22, 2008

(65) Prior Publication Data

US 2008/0132637 A1 Jun. 5, 2008

Related U.S. Application Data

(63) Continuation of application No. 10/490,347, filed on Mar. 22, 2004, now Pat. No. 7,341,783.

(51) Int. Cl.
*B32B 15/092* (2006.01)
*B32B 27/04* (2006.01)
*B32B 27/38* (2006.01)
*C08L 63/00* (2006.01)
*C08L 71/12* (2006.01)

(52) U.S. Cl. .......... 428/416; 428/297.4; 428/413; 428/414; 428/418; 525/523; 525/534; 528/87; 528/104; 528/418; 528/421

(58) Field of Classification Search .......... None
See application file for complete search history.

(56) References Cited

U.S. PATENT DOCUMENTS

| 5,834,565 | A | 11/1998 | Tracy et al. |
| 6,693,149 | B2 | 2/2004 | Yin et al. |
| 7,341,783 | B2 * | 3/2008 | Tokiwa .......... 428/416 |

FOREIGN PATENT DOCUMENTS

| EP | 0 272 439 | 6/1988 |
| EP | 0537005 A1 * | 4/1993 |
| EP | 0592145 A2 * | 4/1994 |
| EP | 0921158 A2 * | 6/1999 |
| JP | 50-015519 | 6/1975 |
| JP | 58-219217 | 12/1983 |
| JP | 63-105022 | 5/1988 |
| JP | 2-233723 | 9/1990 |
| JP | 3-006185 | 1/1991 |
| JP | 05-117387 | 5/1993 |
| JP | 5-214129 | 8/1993 |
| JP | 5-279568 | 10/1993 |
| JP | 6-017457 | 1/1994 |
| JP | 6-206-984 | 7/1994 |
| JP | 7-005818 | 1/1995 |
| JP | 10-101772 | 4/1998 |
| JP | 11-236430 | 8/1999 |
| JP | 11-302529 | 11/1999 |
| JP | 2000-191769 | 7/2000 |
| WO | WO-87/07281 | 12/1987 |
| WO | WO-00/52074 | 9/2000 |

OTHER PUBLICATIONS

Translation of JP 63-105022 (2006).*
Machine Translation of JP 2000-191769, provided by the JPO website (2000).*
Machine Translation of JP 05-117387, provided by the JPO website (1993).*
JPO Abstract of JP 63-105022 (1988).*

* cited by examiner

*Primary Examiner*—Michael J Feely
(74) *Attorney, Agent, or Firm*—Dickstein Shapiro LLP (57) ABSTRACT

An object of the invention is to provide a functionalized polyphenylene ether useful for polymer alloys or electrical or electronic materials such as printed boards or insulating sealants. The invention relates to a functionalized polyphenylene ether having an average of not fewer than 0.1 unit of a structure represented by the following formula (1) per molecular chain:

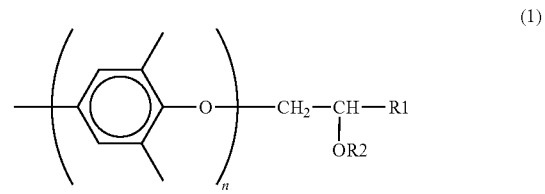

(1)

wherein n is an integer of 9 or more, R1 is an organic substituent having an epoxy group, and R2 is a hydrogen atom or an organic substituent having an epoxy group.

12 Claims, 3 Drawing Sheets

FUNCTIONALIZED POLYPHENYLENE ETHER

CROSS-REFERENCE TO RELATED APPLICATIONS

This application is a continuation of U.S. application Ser. No. 10/490,347, filed on Mar. 22, 2004, now U.S. Pat. No. 7,341,783 the entirety of which is incorporated herein by reference.

BACKGROUND OF THE INVENTION

1. Technical Field

The present invention relates to functionalized polyphenylene ether useful as a resin material for use in electrical and electronic products, automobiles, other various industrial products, and packaging materials and as a resin modifier thereof.

2. Background Art

Polyphenylene ethers are excellent in processability and productivity. They can be molded by molding techniques, such as melt injection molding and melt extrusion molding, into products or parts of desired shapes with efficient productivity. Therefore, they have been widely used as materials for products and parts in the electrical and electronic fields and other various industrial fields, and foods and packaging fields.

Recently, as a result of diversified products and parts particularly in the electrical and electronic fields, automobile field and other various industrial fields, demands for resin materials have also become diverse.

To meet the demands, combining different types of materials and using polymer alloy technology that combines various existent high polymer materials, have led to the development of resin materials that have properties not possessed by the existent materials.

While regular polyphenylene ethers have excellent heat resistance and mechanical properties, they are poor in compatibility with other materials and the choices of counterpart materials to combine with are limited. In particular, polyphenylene ethers have very poor compatibility with highly polar materials, such as polyamide, and to combine them with such resins requires functionalized polyphenylene ethers.

Among functionalized polyphenylene ethers, a polyphenylene ether having an epoxy group is particularly preferred. This is because an epoxy group is highly reactive and easily reacts with various functional groups, such as amino, carboxyl and phenolic hydroxyl groups, and hence abundant types of different polymers are available to combine with. For epoxidized polyphenylene ethers, WO 87/07281, WO 00/52074, JP 7-5818 B, and JP 3-6185 B disclose methods of reacting polyphenylene ethers with low-molecular-weight olefin compounds containing a carbon-carbon double bond or triple bond together with an epoxy group; for example, glycidyl methacrylate and glycidyl acrylate. In these methods, however, since the epoxy group of the low-molecular-weight olefin compound directly reacts with the phenolic hydroxyl group of the polyphenylene ether, the number of epoxy groups that can be efficiently introduced into the high polymer chain is small and thus-prepared epoxidized polyphenylene ether exhibits poor reactivity when it is blended with a different kind of polymer. Therefore, such a blend is not much different in material property from a simple blend of polyphenylene ether with a different kind of polymer.

JP 5-279568 A discloses a method of obtaining an epoxidized polyphenylene ether by reacting a compound having one or two epoxy groups in the molecule with a polyphenylene ether. However, because the reaction is carried out either in a solvent in which the polyphenylene ether is soluble, or where polyphenylene ether is dissolved in the epoxy compound, this method, as a result of the reaction among the epoxy groups, produces crosslinked polyphenylene ether or gelled product, that is insoluble in the solvent; hence impregnating therewith a substrate material, such as a glass fiber, becomes difficult in the process for the production of printed substrate.

JP 5-214129 A describes a method of blending a polyphenylene oxide with a liquid epoxy substance without any solvent. In the method, however, the blend of the polyphenylene ether and the liquid epoxy material forms a paste and thus produces crosslinked polyphenylene ether or gelled product that is insoluble in a solvent, thereby making impregnation of a substrate material, such as a glass fiber, with the product difficult in the process for the production of printed substrate.

Polyphenylene ether resins are suitable materials for printed substrate and insulating sealants for electrical and electronic devices owing to their heat-resistance to high temperatures and low dielectric constant. On the other hand, they have a shortcoming of having low solvent resistance to halogenated solvents, such as trichloroethylene, and aromatic solvents, such as toluene. Thus, in their application to electronic materials, it is required to improve their solvent resistance without impairing the low dielectric property and high heat resistance by crosslinking and curing polyphenylene ethers. As conventional means for crosslinking and curing polyphenylene ethers, methods of adding an excess of a thermosetting resin, such as an epoxy resin, or a crosslinking compound, such as triallyl isocyanurate, have been employed, but the low dielectric property and high heat resistance inherent in polyphenylene ethers cannot be achieved by these methods. For example, polyphenylene ether/polyepoxide compositions are disclosed in JP 6-206984 A, JP 6-17457 B, and JP 11-302529A. In the methods, since crosslinking and curing are effected by adding an excess of polyepoxide to polyphenylene ether, the low dielectric property and high heat resistance inherent in polyphenylene ethers cannot be achieved. JP 11-236430 A discloses a composition composed of polyphenylene ether/brominated epoxy compound/allyl compound; however, this poses a problem that the low dielectric property inherent in polyphenylene ethers is impaired because of large contents of the epoxy compound and allyl compound in the composition.

The invention relates to a functionalized polyphenylene ether which provides polymer alloys with excellent mechanical properties when blended with other resins and yet provides cured products with hardly impared low dielectric property and high heat resistance inherent in polyphenylene ethers.

DISCLOSURE OF THE INVENTION

As a result of the extensive studies on functionalized polyphenylene ethers, the present inventors have found that a functionalized polyphenylene ether having a specific amount of the structure represented by formula (1) shown below, is easily blendable with a different kind of polymer to provide a material excellent in mechanical properties and yet provides a cured product excellent in heat resistance as well as in dielectric property. Furthermore, the inventors have found that a functionalized polyphenylene ether having a specific amount of the structure represented by formula (1) shown below is obtained without causing crosslinking of polyphenylene ether when solid polyphenylene ether is reacted with an epoxy compound with multiple functional groups in a solid phase. These findings have led the inventors to the present invention.

(1)

wherein n is an integer of 9 or more, R1 is an organic substituent having an epoxy group, and R2 is a hydrogen atom or an organic substituent having an epoxy group.

Namely, the invention relates to a functionalized polyphenylene ether having an average of not fewer than 0.1 unit of a structure represented by the following formula (1) per molecular chain:

(1)

wherein n is an integer of 9 or more, R1 is an organic substituent having an epoxy group, and R2 is a hydrogen atom or an organic substituent having an epoxy group.

BEST MODE FOR CARRYING OUT THE INVENTION

The present invention is described in detail below.

The polyphenylene ether used in the present invention is a polymer or copolymer comprises a repeating unit of the following formula:

wherein n is a natural number.

$R_1$, $R_2$, $R_3$, and $R_4$ are each a hydrogen atom, an alkyl group, or an alkyl group having an amino group. Of these, preferred are compounds wherein each of $R_1$ and $R_2$ is a hydrogen atom and each of $R_3$ and $R_4$ is a methyl group.

Specific examples of the polyphenylene ether polymers used in the invention include poly(2,6-dimethyl-1,4-phenylene ether), poly(2-methyl-6-phenyl-1,4-phenylene ether), poly(2-methyl-6-phenyl-1,4-phenylene ether), poly(2,6-dichloro-1,4-phenylene ether), and the like.

Specific examples of the polyphenylene ether copolymers used in the invention include polyphenylene ether copolymers such as copolymers of 2,6-dimethylphenol and other phenols, e.g., 2,3,6-trimethylphenol and 2-methyl-6-methylbutylphenol.

Among them, preferably used are poly(2,6-dimethyl-1,4-phenylene ether), and a copolymer between 2,6-dimethylphenol and 2,3,6-trimethylphenol, and most preferably poly(2,6-dimethyl-1,4-phenylene ether).

The polyphenylene ether used in the invention has a weight-average molecular weight in the range of preferably 1,000 to 80,000, more preferably 1,000 to 50,000, particularly preferably 1,000 to less than 10,000. While the epoxidized polyphenylene ether having a weight-average molecular weight of more than 80,000 exhibits low processability and low crosslinking/curing ability, the epoxidized polyphenylene ether having a weight-average molecular weight of less than 1,000 does not provide a cured polyphenylene ether with good heat resistance and dielectric property.

As the polyphenylene ether for use in the invention, the polyphenylene ether having a broad molecular weight distribution is also useful for the purpose of utilizing both the excellent processability of a low molecular weight polyphenylene ether and the excellent heat resistance and mechanical properties of a high molecular weight polyphenylene ether.

In the invention, the weight-average molecular weight is calculated based on the GPC (gel permeation chromatography) measurement using chloroform as a solvent and the graph of the relationship between molecular weight of polystyrene and elution volume, prepared beforehand.

It is preferred that the polyphenylene ether for use in the invention is of a solid state. This is because polyphenylene ether may crosslink in a solution, or in a melted or past state and form gels. Examples of the polyphenylene ether of a solid state include pellets, granules and powders, but powders are preferable.

A powder of polyphenylene ether is obtainable by, for example, dissolving a polyphenylene ether in a good solvent, such as toluene and xylene, and then adding a poor solvent, such as methanol, to the solution. The particle size of the powder obtained by this method is not particularly limited but, in view of easy handling, is preferably in the range of 1 μm to 1 mm.

As the polyphenylene ether powder for use in the invention, those having a melting point may be also employed.

The melting point of the polyphenylene ether is defined to be the peak top temperature of the peak observed in a temperature-heat flow graph obtained from the measurement by differential scanning calorimeter (DSC) when the temperature is increased at 20° C./minute. When a plurality of peak top temperatures are observed, the melting point of the polyphenylene ether is defined to be the highest one among them.

The polyfunctional epoxy compound used in the invention is not particularly limited as far as it contains two or more epoxy groups in the molecule.

The state of the epoxy compound is not particularly limited but is preferably gas or liquid at the temperature at which the compound is reacted with the polyphenylene ether described below. Or, the epoxy compound may be dissolved in a solvent poor for polyphenylene ether, then mixed and reacted with the latter.

Specific examples of the polyfunctional epoxy compound for use in the invention include 1,3-butadiene diepoxide, 1,2,5,6-diepoxycyclooctane, 1,2,7,8-diepoxyoctane, vinylcyclohexene dioxide, diglycidyl ether, and a group of compounds generally named epoxy resins.

Specific examples of the epoxy resins include butandiol diglycidyl ether, neopentyl glycol diglycidyl ether, trimethylolpropane triglycidyl ether, glycerin triglycidyl ether, triglycidyl isocyanurate, 1,3-diglycidylhydantolein, bisphenol A-type epoxy resins, ethylene glycol diglycidyl ether, diglycidylaniline, and the like, but preferred is a compound represented by the following formula (A):

(A)

wherein m is an integer of 0 to 10 and R5 and R6 are each an organic substituent.

In particular, preferably used is a bisphenol A-type epoxy resin represented by the following formula (5):

(5)

wherein m is an integer of 0 to 10, or ethylene glycol diglycidyl ether represented by the following formula (6):

(6)

The functionalized polyphenylene ether of the invention preferably contains an average of not fewer than 0.1 unit of a structure represented by the following formula (1) per molecular chain:

(1)

wherein n is an integer of 9 or more, R1 is an organic substituent having an epoxy group, and R2 is a hydrogen atom or an organic substituent having an epoxy group.

The functionalized polyphenylene ether of the invention preferably has an average of not fewer than 1.0 unit of the structure represented by the following formula (1) per molecular chain.

It is preferred for the functionalized polyphenylene ether of the invention that R2 in the formula (1) is a hydrogen atom. In the case where the compound has both an epoxy group and a hydroxyl group, the different types of reactive polymers may be one having a functional group reactive to the epoxy group as well as one having a functional group reactive to the aliphatic hydroxyl group.

Examples of the polyphenylene ether having only an epoxy group include the reaction products between polyphenylene ether and epichlorohydrin.

In the structure represented by the above formula (1) of the invention, R1 is more preferably the following formula (2):

(2)

wherein m is an integer of 0 to 10 and R3 and R4 are each an organic substituent, and is more preferably the following formula (2a):

(2a)

wherein m is an integer of 0 to 10, or the following formula (2b):

wherein m is an integer of 0 to 10.

In the reaction of the polyphenylene ether and the polyfunctional epoxy compound according to the invention, the amount of the added polyfunctional epoxy compound is not particularly limited, but is preferably 1 to 100 parts by weight, more preferably 5 to 70 parts by weight, particularly preferably 10 to 50 parts by weight, per 100 parts by weight of the polyphenylene ether. The use of less than 1 part by weight of the polyfunctional epoxy compound results in a low reaction rate, whereas the use of more than 100 parts by weight thereof may cause melting of the polyphenylene ether during the reaction.

The weight-average molecular weight of the functionalized polyphenylene ether of the invention is in the range of preferably 1,000 to 80,000, more preferably 1,000 to 50,000, particularly preferably 1,000 to less than 10,000.

When the weight-average molecular weight is less than 1,000, the mechanical properties, heat resistance, and dielectric property inherent in the polyphenylene ether are not exhibited and, when the weight-average molecular weight exceeds 80,000, processability and crosslinking/curing ability decrease.

The functionalized polyphenylene ether of the invention may be a mixture of those having a weight-average molecular weight of less than 10,000 and those having a weight-average molecular weight of 10,000 or more. Although a low molecular weight component having a weight-average molecular weight of less than 10,000 has excellent processability, its heat resistance and mechanical properties, such as impact strength, are inferior. On the other hand, a high molecular weight component having a weight-average molecular weight of 10,000 or more has excellent heat resistance and mechanical properties, such as impact strength, but has inferior processability. The mixing of both components, i.e., the low molecular weight and high molecular weight components, provides a material having a good balance of heat resistance and mechanical properties such as impact strength and processability. Also, by changing the mixing proportion of both components, material properties can be easily controlled.

In the invention, the chlorine content of the functionalized polyphenylene ether is preferably 100 ppm or less, more preferably 50 ppm or less, particularly preferably 10 ppm or less. When chlorine content exceeds 100 ppm, ion migration may occur in the insulating layers of printed substrate, which may result in insulation deterioration.

The functionalized polyphenylene ether of the invention may be in either of powder or pellet state, but powder is preferred. The particle size of the powder is not particularly limited. However, it is preferred for easy handling that the particle size is 1 μm to 1 mm, preferably 50 μm to 800 μm, more preferably 100 μm to 500 μm.

The functionalized polyphenylene ether of the invention may contain an unreacted epoxy compound.

The reaction of the polyphenylene ether and the polyfunctional epoxy compound according to the invention is preferably carried out in a solid phase wherein the polyphenylene ether is maintained in a solid state. In the case where the polyphenylene ether is in a solution, or a melted or pasty state, crosslinking or gelation may occur during the reaction.

In the invention, the higher the temperature during the reaction between the polyphenylene ether and the polyfunctional epoxy compound, the higher the reaction rate. However, when the temperature exceeds 200° C., the polyphenylene ether may melt, crosslink, or gelate, and the color tone of the product may deteriorate. The temperature range is preferably −70 to 200° C., more preferably 25 to 95° C.

As a catalyst for the reaction of the polyphenylene ether and the polyfunctional epoxy compound, an organic or inorganic basic compound may be used and an amine compound is desirable.

Specifically, examples thereof include trimethylamine, triethylamine, tripropylamine, tributylamine, n-butyldimethylamine, tri-n-octylamine, 2-ethylhexylamine, tetramethylethylenediamine, and N-methylimidazole. Among them, trimethylamine, triethylamine, tripropylamine, tributylamine, and butyldimethylamine are preferred.

As basic compounds other than the above, butyllithium, sodium methylate, sodium hydroxide, potassium hydroxide, and the like may be mentioned, but side reactions such as ring-opening of the epoxy group and polymerization of the epoxy compound may sometimes occur. In that case, the number of the epoxy groups introduced into the polyphenylene ether decreases.

The addition amount of the basic compound for use in the reaction of the polyphenylene ether and the polyfunctional epoxy compound according to the invention is not particularly limited but is in the range of preferably 0.01 to 50 parts by weight, more preferably 0.05 to 10 parts by weight, and particularly preferably 0.1 to 5 parts by weight relative to 100 parts by weight of the polyphenylene ether.

The functionalized polyphenylene ether of the invention may be employed in a composition with another thermoplastic resin or curable resin.

Examples of the thermoplastic resin include homopolymers of vinyl compounds such as ethylene, propylene, butadiene, isoprene, styrene, methacrylic acid, acrylic acid, methacrylate esters, acrylate esters, vinyl chloride, acrylonitrile, maleic anhydride, and vinyl acetate, copolymers of two or more vinyl compounds, and polyamides, polyimides, polycarbonates, polyesters, polyacetals, polyphenylene sulfides, polyethylene glycols, and the like, but the resin is not limited thereto.

Examples of the curable resin include phenol resins and epoxy resins but the resin is not limited thereto. The above thermoplastic resins and curable resins may be modified with a functionalized compound.

In the case where the functionalized polyphenylene ether of the invention and an epoxy resin are employed as a curable resin composition, the smaller the epoxy resin content, the better the heat resistance and dielectric property of the resulting cured product. The content of the epoxy resin is preferably 50% by weight or less, more preferably 20% by weight or less, and particularly preferably 10% by weight or less.

The functionalized polyphenylene ether of the invention can be also combined with an organic or inorganic material of a different type. Examples of the organic or inorganic materials of different types include glass fibers, aramide fibers, glass hollow spheres, carbon fibers, polyacrylonitrile fibers, whiskers, mica, talc, carbon black, titanium oxide, zinc oxide, magnesium sulfate, calcium carbonate, wollastonite, conductive metal fibers and the like, but are not limited thereto.

The epoxidized polyphenylene ether of the invention reacts with various curing agents and is crosslinked to provide a crosslinked polyphenylene ether useful for electronic devices such as printed circuit boards and sealants.

The functionalized polyphenylene ether of the invention reacts with a curing agent used for curing epoxy resins and forms a cured product. Such curing agents may be those having a functional group in the molecule that is reactive to an epoxy group or a hydroxyl group such as those having an amino group, a hydroxyl group, a phenolic hydroxyl group, a thiol group or an acid anhydride group in the molecules. Of these, a polyfunctional amine compound is preferred.

Examples of polyfunctional amine compound include ethylenediamine, diethylenetriamine, triethylenetetramine, tetraethylenepentamine, pentaethylenehexamine, polymethylenediamine, xylylenediamine, dicyandiamide, and the like.

The addition amount of the curing agent for use in the invention is preferably 0.1 to 20 parts by weight per 100 parts by weight of the functionalized polyphenylene ether. When the amount is less than 0.1 part by weight, the composition is not sufficiently cured. When the amount exceeds 20 parts by weight, the heat resistance and dielectric property of the cured product are deteriorated and not preferable.

The curable resin composition comprising the functionalized polyphenylene ether of the invention, a curing agent, a phosphorus compound and/or a silicon compound provides a halogen-free curable resin composition with a sufficient flame retardancy.

The addition amount of the phosphorus compound and the silicon compound for use in the invention is preferably 0.1 to 40 parts by weight. When the amount is less than 0.1 part by weight, a sufficient flame retardancy is not achieved. When the amount exceeds 40 parts by weight, the heat resistance and dielectric property of the cured product are deteriorated and are not preferable.

The phosphorus compound for use in the invention may be any compound as far as it contains a phosphorus atom, and examples thereof include phosphates such as trisubstituted phosphates, phosphine oxides such as trisubstituted phosphine oxides, red phosphorus, phosphazene derivatives, and the like. Of these, phosphazene derivatives are preferred.

As the silicon compound for use in the invention, silica, a polyorganosiloxane, a basket-shape silsesquioxane, and a polyorganosiloxane modified with a functional group, such as an amino group, an epoxy group, a hydroxyl group, and an alkoxy group, are preferred.

Silica is represented by $SiO_2$ as its basic structural formula, and fumed silica is preferred in view of flame retardancy. Fumed silica is also called porous silica, which is composed of fine particles having a primary particle size of 5 to 50 nm and a very large specific surface area as large as about 50 to 500 $m^2/g$. Those of standard hydrophilic type and hydrophobic type whose surfaces are chemically covered with hydrophobic groups, such as methyl groups, can be employed. Specifically, AEROSIL® (registered trademark) of Nippon Aerosil Co., Ltd. is suitable and the grades 200, R972, etc. are suitably used. The addition of silica imparts flame retardancy and also improves dimensional stability of cured articles and molded articles.

When a cyclic nitrogen compound is added to the curable resin composition of the invention together with the silicon compound, flame retardancy is further improved. As the cyclic nitrogen compound, melamine, melem, and mellon are preferred.

The polyphenylene ether having an epoxy group of the invention can contain appropriate additive(s) according to the purpose. The additives include flame retardants, heat stabilizers, antioxidants, UV absorbers, surface active agents, lubricants, fillers, polymer additives, dialkyl peroxides, peroxy, peroxycarbonates, hydroperoxides, peroxy ketals, and the like.

The composite material of the invention comprises the crosslinked product of the functionalized polyphenylene ether of the invention and a base material. As the base material, various glass cloth such as roving cloth, cloth, chopped-strand mat, and surfacing mat, synthetic or natural inorganic fiber fabrics, such as asbestos fabric, metal fiber fabric, and others, woven fabrics or non-woven fabrics obtained from liquid crystal fibers, such as all-aromatic polyamide fibers, all-aromatic polyester fibers, and polybenzoxazole fibers, natural fiber cloth, such as cotton cloth, hemp cloth, and felt, carbon fiber cloth, natural cellulose cloth, such as kraft paper, cotton paper, and paper-glass mixed filament yarn, polytetrafluoroethylene porous film, and the like, can be employed singly or in combination of two or more thereof.

The proportion of such base material is 5 to 90 parts by weight, more preferably 10 to 80 parts by weight, further preferably 20 to 70 parts by weight relative to 100 parts by weight of the curable composite material.

The laminate of the invention comprises the composite material of the invention and a metal foil. Examples of the metal foil include copper foil, aluminum foil, and the like. The thickness thereof is not particularly limited but is in the range of 3 to 200 μm, more preferably 3 to 105 μm.

EXAMPLES

The present invention will be illustrated in greater detail with reference to the following Examples, but the invention should not be construed as being limited thereto.

Evaluation Method

1. Purification of Functionalized Polyphenylene Ether Immediately After Reaction First, in order to remove an unreacted polyfunctional epoxy compound remaining in the functionalized polyphenylene ether powder after the reaction, 2 g of the reaction product were dissolved in 20 ml of toluene and then a large excess of methanol was added to precipitate the polymers. The precipitated polymers were separated by filtration and dried under the reduced pressure of 0.1 mmHg at 100° C. for 1 hour.

2. Proton NMR Measurement of Functionalized Polyphenylene Ether

The functionalized polyphenylene ether obtained through the purification operation 1 was dissolved in deutero-chloroform and measured using 270 MHz NMR. The chemical shift of each peak was determined using the peak of tetramethylsilane (0.00 ppm) as a standard. The number of epoxy groups per molecule of the polyphenylene ether was determined based on the area ratio of the peak originated from the protons at the 3- and 5-positions of the aromatic ring (6.47 ppm) of the polyphenylene ether to the peak originated from the epoxy group.

3. Molecular Weight Measurement of Polyphenylene Ether

GPC measurement was conducted using chloroform as a solvent and the molecular weight was calculated based on the graph of the relationship between the molecular weight of polystyrene and the elution volume, which had been prepared beforehand.

4. Chemical Resistance Test

After 3.0 g of a cured product were immersed in methylene chloride at 35° C. for 5 minutes, the product was air-dried for 5 minutes and then weighed. The percent weight change before and after the immersion was determined according to the following equation.

Percent Weight Change(%)={(3.0−(weight after immersion))/(3.0)}×100

Example 1

Figure 1:
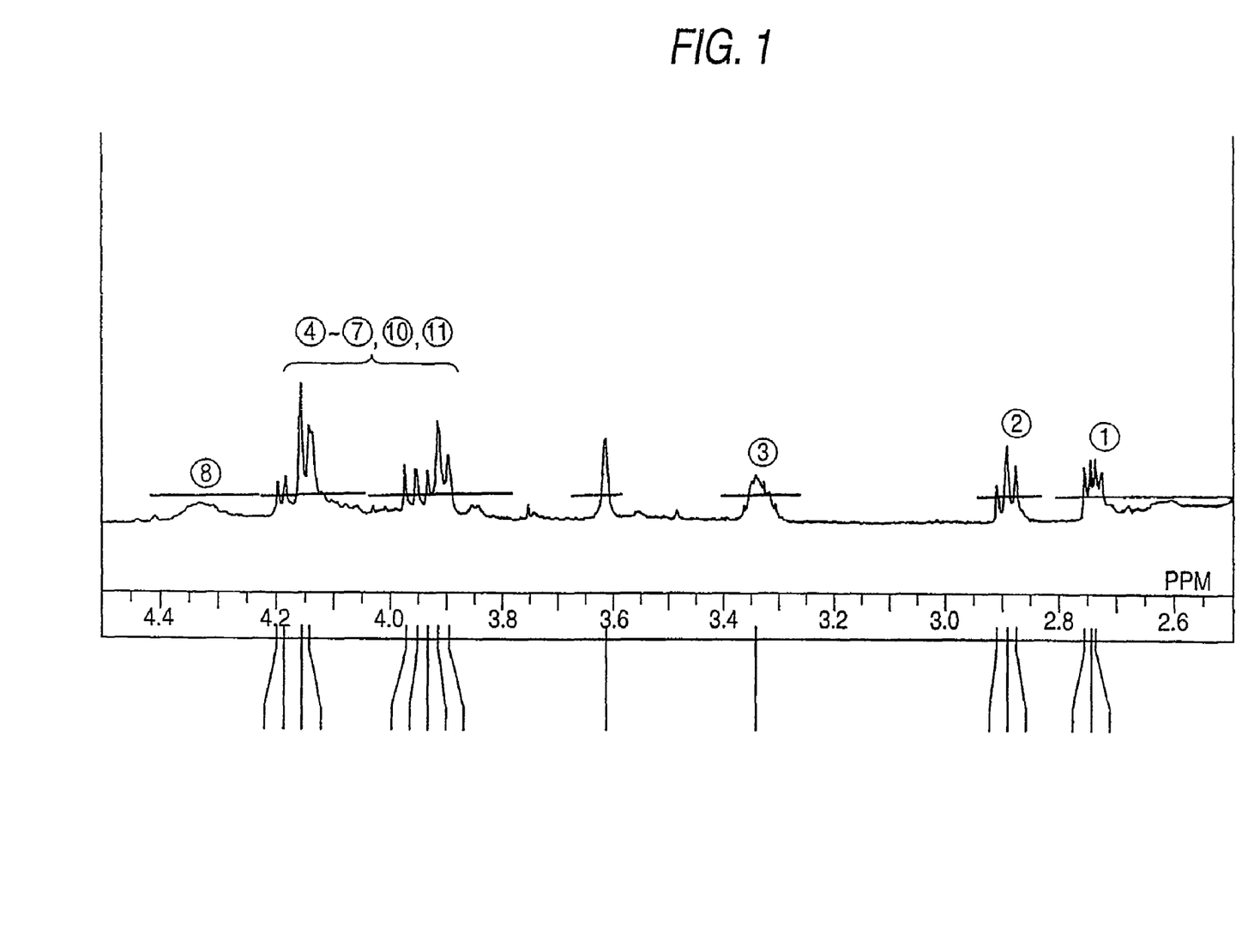
FIG. 1 is a proton NMR spectrum of the functionalized polyphenylene ether obtained in Example 1.

After mixing well 2.0 g of powdery polyphenylene ether having a number-average molecular weight of 18,600 and a weight-average molecular weight of 42,500 with 0.5 g of a bisphenol A-type epoxy resin (AER 250 manufactured by Asahi Kasei Epoxy Co., Ltd.) and 0.05 g of tri-n-butylamine, the mixture was sealed in the autoclave and heated at 120° C. for 2 hours. Since the resulting reaction product was powdery like the starting polyphenylene ether, it was confirmed that the polyphenylene ether maintained its solid state without melting during the reaction. The reaction product was treated in accordance with the purification method for polyphenylene ether containing epoxy group as described in item 1 above, and GPC and proton NMR measurements were conducted. The shape of the GPC curve of the polymers after the reaction well coincided with the shape of the GPC curve of the starting polyphenylene ether, thereby confirming no occurrence of crosslinking reaction. FIG. 1 shows the proton NMR spectrum of this functionalized polyphenylene ether. As a result of the proton NMR measurement, the functionalized polyphenylene ether was confirmed to have a structure represented by the following formula (7):

(7)

wherein n is a natural number. In the structural formula, the numerical numbers attached to the hydrogen atoms correspond to the numerical numbers attached to the peaks of the proton NMR spectrum in FIG. 1.

For example, it is meant that the peak (1) of the proton NMR is originated from the hydrogen atom H(1) in the structural formula. The peaks observed at 2.73 to 2.75 ppm, 2.87 to 2.91 ppm, and 3.34 ppm are originated from the protons of the epoxy group. As a result of the calculation based on the ratio of these peak areas to the peak areas of the protons at the 3- and 5-positions of the phenylene ether unit, it was found that the polymers after the reaction had 1.6 epoxy groups per molecule on the average.

Examples 2 to 8

Each reaction was carried out in the same manner as in Example 1, except that the proportions of the bisphenol A-type epoxy resin and tri-n-butylamine and the reaction temperature were changed. Since the resulting reaction product was powdery like the starting polyphenylene ether, it was confirmed that the polyphenylene ether did not melt and maintained its solid state during the reaction. Based on the results from the GPC measurement of functionalized polyphenylene ether, it was confirmed that no crosslinking occurred during the reaction in all Examples. Also, the result of proton NMR analysis confirmed that the functionalized polyphenylene ethers all had the structure of the formula (7). Table 1 shows the average number of epoxy groups per molecule of polymers after the reaction.

TABLE 1

|  | Bisphenol A-type epoxy resin (g) | Tri-n-butylamine (g) | Reaction temperature (° C.) | Number of epoxy groups/molecule |
|---|---|---|---|---|
| Example 1 | 0.3 | 0.05 | 120 | 1.6 |
| Example 2 | 0.3 | 0.05 | 140 | 1.4 |
| Example 3 | 0.3 | 0.05 | 90 | 1.5 |
| Example 4 | 2.0 | 0.05 | 40 | 0.6 |
| Example 5 | 0.3 | 0 | 140 | 0.7 |
| Example 6 | 1.0 | 0.05 | 60 | 1.5 |
| Example 7 | 0.5 | 0.05 | 80 | 1.4 |
| Example 8 | 0.1 | 0.05 | 120 | 1.2 |

Comparative Example 1

A reaction was carried out in the same manner as in Example 1, except that the reaction temperature was changed to 220° C. The resulting reaction product was a solid matter formed by complete melting and integration of powder particles. The reaction product was purified in accordance with Evaluation Method 1. As a result of GPC measurement, it was confirmed that the GPC curve was largely broadened toward the high molecular weight side as compared with that of the starting polyphenylene ether and thus confirmed the occurrence of crosslinking during the reaction.

Example 9

A reaction was carried out in the same manner as in Example 1, except that ethylene glycol diglycidyl ether of the formula:

was used instead of the bisphenol A-type epoxy resin as an epoxy compound. Since the resulting reaction product was powdery like the starting polyphenylene ether, it was confirmed that the polyphenylene ether maintained its solid state without melting during the reaction. As a result of GPC measurement of the resulting functionalized polyphenylene ether, it was confirmed that no crosslinking had occurred during the reaction in all Examples. As a result of proton NMR analysis, in all Examples, it was confirmed that the functionalized polyphenylene ether had the structure of the formula (8):

starting polyphenylene ether and thus a crosslinking reaction occurred during the reaction.

Examples 14 to 18

Each reaction was carried out in the same manner as in Example 1, except that different catalysts were used in place of tri-n-butylamine. Since the resulting reaction product was powdery like the starting polyphenylene ether, it was confirmed that the polyphenylene ether maintained its solid state without melting during the reaction. Based on the results of GPC measurement of the functionalized polyphenylene ethers, it was confirmed that no crosslinking occurred during the reaction. As a result of proton NMR analysis, it was confirmed that the functionalized polyphenylene ethers had the structure of the formula (7) in all Examples. Table 3 shows the results.

(8)

wherein n is a natural number.

As a result of the calculation based on the ratio of the peak areas of the epoxy protons to the peak areas of the protons at the 3- and 5-positions of the phenylene ether unit, it was found that the polymers after the reaction had 1.4 epoxy groups per molecule on the average.

Examples 10 to 13

Each reaction was carried out in the same manner as in Example 9, except that the proportions of ethylene glycol diglycidyl ether and tri-n-butylamine and the reaction temperature were changed. Since the resulting reaction product was powdery like the starting polyphenylene ether, it was confirmed that the polyphenylene ether maintained its solid state without melting during the reaction. Based on the results of GPC measurement of the functionalized polyphenylene ethers, it was confirmed that no crosslinking had occurred during the reaction. As a result of proton NMR analysis, it was confirmed that the functionalized polyphenylene ethers had the structure of the formula (8) in all Examples. Table 2 shows the average number of epoxy groups per molecule of polymers after the reaction.

TABLE 2

|  | Ethylene glycol diglycidyl ether (g) | Tri-n-butylamine (g) | Reaction temperature (° C.) | Number of epoxy groups/ molecule |
|---|---|---|---|---|
| Example 9 | 0.3 | 0.05 | 120 | 1.4 |
| Example 10 | 0.5 | 0.05 | 120 | 1.3 |
| Example 11 | 1.0 | 0.05 | 90 | 1.2 |
| Example 12 | 2.0 | 0.05 | 40 | 1.2 |
| Example 13 | 0.3 | 0 | 120 | 0.7 |

Comparative Example 2

A reaction was carried out in the same manner as in Example 9, except that the reaction temperature was changed to 220° C. The resulting reaction product was a solid matter formed by complete melting and integration of powder particles. The reaction product was purified in accordance with Evaluation Method 1. As a result of GPC measurement, it was confirmed that the GPC curve was largely broadened toward the high molecular weight side as compared with that of the

TABLE 3

|  | Catalyst species | Number of epoxy groups/ molecule |
|---|---|---|
| Example 14 | Triethylamine | 1.6 |
| Example 15 | n-Butyldimethylamine | 1.5 |
| Example 16 | Tri-n-octylamine | 1.4 |
| Example 17 | Tetramethylethylenediamine | 0.8 |
| Example 18 | N-methylimidazole | 0.6 |

Example 19

Figure 2:
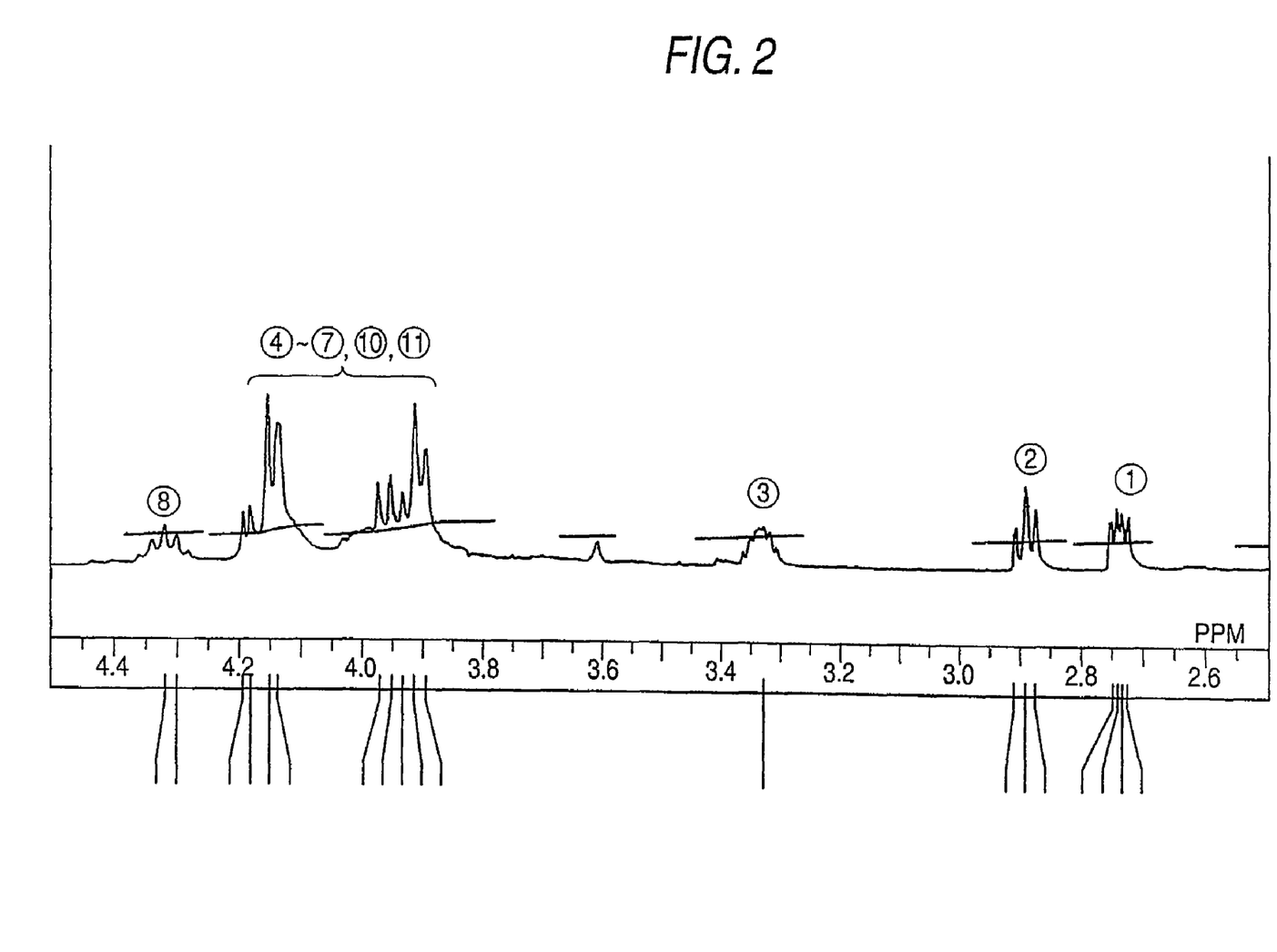
FIG. 2 is a proton NMR spectrum of the functionalized polyphenylene ether obtained in Example 19.

After mixing well 2.0 g of powdery polyphenylene ether having a number-average molecular weight of 1,770 and a weight-average molecular weight of 2,680 with 0.7 g of a bisphenol A-type epoxy resin (AER 250 manufactured by Asahi Kasei Epoxy Co., Ltd.) and 0.05 g of tri-n-butylamine, the mixture was sealed in the autoclave and heated at 80° C. for 2 hours. Since the resulting reaction product was powdery like the starting polyphenylene ether, it was confirmed that the polyphenylene ether maintained its solid state without melting during the reaction. Based on the result of GPC measurement, it was confirmed that no crosslinking had occurred during the reaction. FIG. 2 shows the proton NMR spectrum of this functionalized polyphenylene ether. As a result of proton NMR measurement, it was confirmed that the functionalized polyphenylene ether had a structure represented by the following formula (7):

(7)

wherein n is a natural number.

In the structural formula, the numerical numbers attached to hydrogen atoms correspond to the numerical numbers attached to the peaks of the proton NMR spectrum in FIG. 2. As a result of the calculation based on the ratio of the peak areas of the epoxy protons to the peak areas of the protons at the 3- and 5-positions of the phenylene ether unit, it was found that the polymers after the reaction had 1.2 epoxy groups per molecule on the average.

Examples 20 to 23

Each reaction was carried out in the same manner as in Example 19, except that the proportions of the bisphenol A-type epoxy resin and tri-n-butylamine and the reaction temperature were changed. Since the resulting reaction product was powdery like the starting polyphenylene ether, it was confirmed that the polyphenylene ether maintained its solid state without melting during the reaction. Based on the results of GPC measurement, it was confirmed that no crosslinking had occurred during the reaction. Moreover, as a result of proton NMR analysis, it was confirmed that the functionalized polyphenylene ether had the structure of the following formula (7):

(7)

wherein n is a natural number.

In the structural formula, the numerical numbers attached to hydrogen atoms correspond to the numerical numbers attached to the peaks of the proton NMR spectrum in FIG. 2. As a result of the calculation based on the ratio of the peak areas of the epoxy protons to the peak areas of the protons at the 3- and 5-positions of the phenylene ether unit, the numbers of epoxy groups contained in the polymers after the reaction are shown in Table 4.

TABLE 4

|  | Bisphenol A-type epoxy resin (g) | Tri-n-butylamine (g) | Reaction temperature (° C.) | Number of epoxy groups/ molecule |
|---|---|---|---|---|
| Example 19 | 0.7 | 0.05 | 80 | 1.2 |
| Example 20 | 0.7 | 0.05 | 120 | 1.1 |
| Example 21 | 1.0 | 0.05 | 60 | 1.0 |

TABLE 4-continued

|  | Bisphenol A-type epoxy resin (g) | Tri-n-butylamine (g) | Reaction temperature (° C.) | Number of epoxy groups/ molecule |
|---|---|---|---|---|
| Example 22 | 2.0 | 0.05 | 30 | 1.0 |
| Example 23 | 0.5 | 0 | 80 | 0.5 |

Comparative Example 3

A reaction was carried out in the same manner as in Example 19, except that the reaction temperature was changed to 220° C. The resulting reaction product was a solid matter formed by complete melting and integration of powder particles. The reaction product was purified in accordance with Evaluation Method 1. As a result of GPC measurement, it was confirmed that the GPC curve was largely broadened toward the high molecular weight side as compared with that of the starting polyphenylene ether, thereby confirming the occurrence of crosslinking during the reaction.

Example 24

Figure 3:
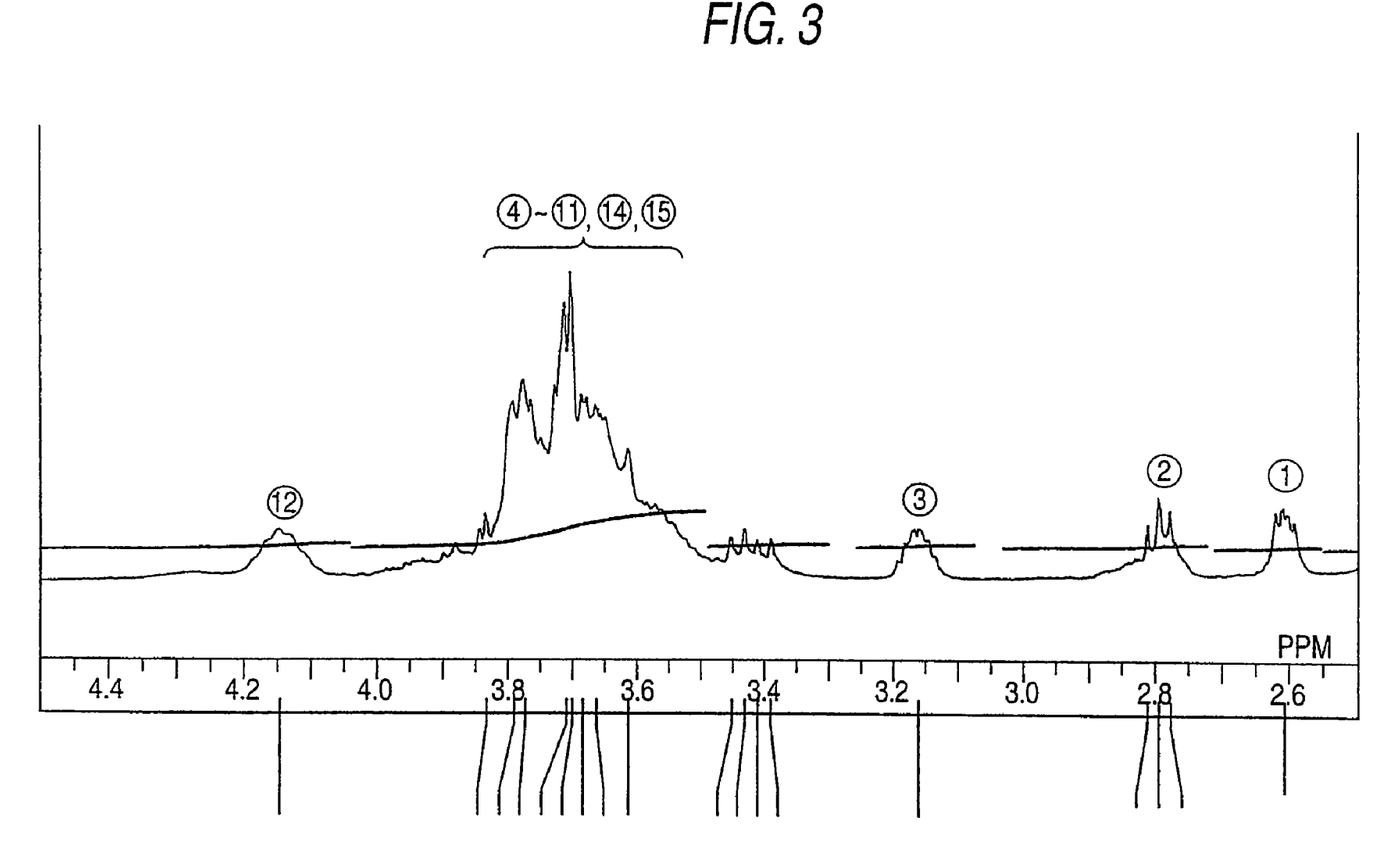
FIG. 3 is a proton NMR spectrum of the functionalized polyphenylene ether obtained in Example 24.

A reaction was carried out in the same manner as in Example 19, except that ethylene glycol diglycidyl ether was used instead of the bisphenol A-type epoxy resin. Since the resulting reaction product was powdery like the starting polyphenylene ether, it was confirmed that the polyphenylene ether maintained its solid state without melting during the reaction. As a result of GPC measurement of the functionalized polyphenylene ether, it was confirmed that no crosslinking occurred during the reaction. FIG. 3 shows the proton NMR spectrum of this functionalized polyphenylene ether. As a result of the proton NMR analysis, it was confirmed that the functionalized polyphenylene ether had the structure of the formula (8). Moreover, it was found that the polymers after the reaction had 1.2 epoxy groups per molecule on the average.

Examples 25 to 29

Each reaction was carried out in the same manner as in Example 19, except that the proportions of ethylene glycol diglycidyl and tri-n-butylamine and the reaction temperature were changed. Since the resulting reaction product was powdery like the starting polyphenylene ether, it was confirmed that the polyphenylene ether maintained its solid state without melting during the reaction. Based on the results of GPC measurement of the functionalized polyphenylene ethers, it was confirmed that no crosslinking occurred during the reaction. As a result of proton NMR analysis, it was confirmed that the functionalized polyphenylene ethers had the structure of the formula (8) in all Examples. Table 5 shows the results.

TABLE 5

|  | Ethylene glycol diglycidyl ether (g) | Tri-n-butylamine (g) | Reaction temperature (° C.) | Number of epoxy groups/molecule |
|---|---|---|---|---|
| Example 24 | 0.7 | 0.05 | 80 | 1.2 |
| Example 25 | 0.5 | 0.05 | 120 | 1.1 |
| Example 26 | 1.0 | 0.05 | 60 | 1.0 |
| Example 27 | 2.0 | 0.05 | 30 | 1.0 |
| Example 28 | 0.5 | 0 | 80 | 0.5 |
| Example 29 | 0.5 | 0.02 | 80 | 0.7 |

Comparative Example 4

A reaction was carried out in the same manner as in Example 24, except that the reaction temperature was changed to 220° C. The resulting reaction product was a solid matter formed by complete melting and integration of powder particles. The reaction product was purified in accordance with Evaluation Method 1. As a result of GPC measurement, it was confirmed that the GPC curve was largely broadened toward the high molecular weight side as compared with that of the starting polyphenylene ether, thereby confirming the occurrence of crosslinking during the reaction.

Examples 30 to 34

Each reaction was carried out in the same manner as in Example 19, except that different catalysts were used in place of tri-n-butylamine. Since the resulting reaction product was powdery like the starting polyphenylene ether, it was confirmed that the polyphenylene ether maintained its solid state without melting during the reaction. Based on the results of GPC measurements of the functionalized polyphenylene ethers, it was confirmed that no crosslinking occurred during the reaction. Moreover, as a result of the proton NMR analysis, it was confirmed that the functionalized polyphenylene ethers had the structure of the formula (7) in all Examples. Table 6 shows the results.

TABLE 6

|  | Catalyst species | Number of epoxy groups/molecule |
|---|---|---|
| Example 30 | Triethylamine | 1.4 |
| Example 31 | n-Butyldimethylamine | 1.2 |
| Example 32 | Tri-n-octylamine | 1.1 |
| Example 33 | Tetramethylethylenediamine | 0.9 |
| Example 34 | N-methylimidazole | 0.8 |

Comparative Example 5

In 18 g of toluene were dissolved 2.0 g of powdery polyphenylene ether as the one used in Example 1, 0.5 g of a bisphenol A-type epoxy resin (AER 250 manufactured by Asahi Kasei Epoxy Co., Ltd.), and 0.05 g of tri-n-butylamine. The toluene solution was sealed in the autoclave and heated at 120° C. for 2 hours. When the solution after the reaction was poured into a large excess of methanol, white precipitates were obtained. The precipitates were separated by filtration and then dried in accordance with the method described in the above paragraph "1. Purification of Functionalized Polyphenylene Ether", to obtain a white powder. When 0.02 g of the powder were mixed with 20 ml of chloroform, a lot of solid matters insoluble in chloroform were observed. As a result of GPC measurement of the chloroform-soluble portion, it was confirmed that the GPC curve was largely broadened toward the high molecular weight side as compared with that of the starting polyphenylene ether, confirming the occurrence of crosslinking during the reaction.

Comparative Example 6

In 27 kg of toluene were dissolved 3.0 kg of powdery polyphenylene ether as the one used in Example 1, 750 g of a bisphenol A-type epoxy resin (AER 250 manufactured by Asahi Kasei Epoxy Co., Ltd.), and 75 g of tri-n-butylamine. The solution was placed into a 40 L reaction vessel equipped with a stirrer. The toluene solution in the vessel was heated to 120° C. and continuously stirred at that temperature for 2 hours. When 50 kg of methanol were added to 5 kg of the solution, precipitates of polymers were obtained, which were recovered and dried. By repeating the operation, 2.9 kg of dried polymers were obtained. As a result of GPC measurement of the polymers, it was confirmed that the GPC curve was largely broadened toward the high molecular weight side as compared with that of the starting polyphenylene ether, thereby confirming the occurrence of crosslinking during the reaction.

After 40 parts by weight of the polymer powder, 10 parts by weight of hydrogenated styrene-butadiene block copolymer, 45 parts by weight of polyamide 66 resin, and 5 parts by weight of polyamide 6 resin were well mixed, the attempt was made to knead and extrude the resulting mixture at 320° C. using a biaxial extruder ZSK-25 manufactured by Werner, but the strands were unstable and could not be pelletized.

Comparative Example 7

After mixing well 3.0 kg of powdery polyphenylene ether as the one used in Example 1 with 750 g of a bisphenol A-type epoxy resin (AER 250 manufactured by Asahi Kasei Epoxy Co., Ltd.) and 75 g of tri-n-butylamine, 40 parts by weight of the mixture, 10 parts by weight of a hydrogenated styrene-butadiene block copolymer, 45 parts by weight of polyamide 66 resin, and 5 parts by weight of polyamide 6 resin were well mixed and the attempt was made to knead and extrude the resulting mixture at 320° C. using a biaxial extruder ZSK-25 manufactured by Werner, but the strands were unstable and could not be pelletized.

Example 36

After 3.0 kg of powdery polyphenylene ether as the one used in Example 1, 750 g of a bisphenol A-type epoxy resin (AER 250 manufactured by Asahi Kasei Epoxy Co., Ltd.), and 75 g of tri-n-butylamine were well mixed in a plastic bag, the resulting mixture was charged into a Henschel mixer FM10C/1 manufactured by Mitsui Mining Co., Ltd. and stirring was started at 600 rpm. A heated oil was introduced into a mixer jacket so as to adjust product temperature in the mixer to be 120° C. and heating and stirring were continued. After 2 hours, the resulting reaction product in the mixer was taken out. When part thereof was purified in accordance with the above Evaluation Method 1 and subjected to NMR analysis, it was found that the product had 1.6 epoxy groups per molecule chain on the average.

Example 37

The reaction product obtained in Example 36 was washed well with acetone to remove the unreacted epoxy resin. After 40 parts by weight of the powder of the resulting functionalized polyphenylene ether, 10 parts by weight of a hydrogenated styrene-butadiene block copolymer, 45 parts by weight of a polyamide 66 resin, and 5 parts by weight of a polyamide 6 resin were well mixed, kneading and extrusion of the resulting mixture were conducted at 320° C. using a biaxial extruder ZSK-25 manufactured by Werner to obtain pellets. The pellets were molded using injection molding machine into ASTM standardized test pieces, whose Izod (with notches) impact resistance (ASTM D-256: 23° C.) was measured and found to be 240 J/m.

Example 38

In 200 g of toluene were dissolved under stirring 100 g of the reaction product from Example 36, 2.0 g of triethylenetetramine, and 0.3 g of dimethylsilicone. A glass cloth with a specific weight of 107 g/m² was immersed therein for impregnation and then dried in an air oven to obtain a prepreg.

Then, six sheets of the above prepregs were piled so that the thickness after curing would become about 0.8 mm. Copper foils having a thickness of 35 μm were placed on both sides of the piled prepregs and molding and curing were effected at 150° C. and 40 kg/cm² for 90 minutes using a press molding machine.

When the laminate was subjected to a combustion test in accordance with UL94 standard, self-extinction was observed within 5 seconds.

Moreover, the dielectric constant of the laminate at 1 MHz was found to be 3.4 and Tg was 185° C.

Example 39

A 3 g portion of the reaction product from Example 36 and 0.1 g of triethylenetetramine were well mixed. The mixture was heated and compressed at 280° C. and 40 kg/cm² for 90 minutes using a press molding machine and then cooled at 40° and 40 kg/cm² for 10 minutes to obtain a film. When the film was subjected to a solvent resistance test, the percent weight change was found to be 3.2%.

Example 40

A reaction was carried out in the same manner as in Example 1, except that a polyglycidylamine compound of the formula:

was used instead of the bisphenol A-type epoxy resin as an epoxy compound. The GPC curve of the resulting polymers after the reaction well coincided with the GPC curve of the starting polyphenylene ether in every case. In addition, as a result of proton NMR measurement, it was found that the polymers after the reaction had 5.5 epoxy groups per molecule on the average.

Comparative Example 8

In a 10 L vessel were dissolved 2.7 kg of powdery polyphenylene ether as the one used in Example 1 and 300 g of glycidyl acrylate in 5.1 kg of toluene at 80° C. under a nitrogen stream. A solution of 45 g of benzoyl peroxide dissolved in 900 g of toluene was gradually added dropwise into the vessel. After the dropwise addition, a reaction was carried out at 80° C. for 5 hours under heating and stirring.

After completion of the reaction, the reaction solution was transferred into a 100 L vessel equipped with a stirrer and 60 kg of methanol was gradually added thereto under stirring to form a slurry, which was then filtrated and dried under reduced pressure to obtain 2.5 kg of a white powder. Part of the powder was purified in accordance with the above Evaluation Method 1 and subjected to proton NMR analysis; but no peak originated from an epoxy group was observed.

Comparative Example 9

After 40 parts by weight of the powder obtained in Comparative Example 8, 10 parts by weight of a hydrogenated styrene-butadiene block copolymer, 45 parts by weight of a polyamide 66 resin, and 5 parts by weight of a polyamide 6 resin were well mixed, kneading and extrusion of the resulting mixture were conducted at 320° C. using a biaxial extruder ZSK-25 manufactured by Werner to obtain pellets. The pellets were molded using an injection molding machine into ASTM standardized test pieces, whose Izod (with notches) impact resistance (ASTM D-256: 23° C.) was measured and found to be 40 J/m.

Example 41

After 3.0 kg of powdery polyphenylene ether having a number-average molecular weight of 1,770 and a weight-average molecular weight of 2,680, 750 g of a bisphenol A-type epoxy resin (AER 250 manufactured by Asahi Kasei Epoxy Co., Ltd.), and 75 g of tri-n-butylamine were well mixed in a plastic bag, the resulting mixture was charged into a Henschel mixer FM10C/1 manufactured by Mitsui Mining Co., Ltd. and stirring was started at 600 rpm. A heated oil was introduced into a mixer jacket so as to adjust product temperature in the mixer to be 80° C. and heating and stirring were continued. After 2 hours, it was confirmed that the reaction product in the mixer was powdery like the starting material. When part thereof was purified in accordance with the above Evaluation Method 1 and subjected to NMR analysis, it was found that the product had 1.3 epoxy groups per molecule chain on the average.

Example 42

In 200 g of toluene were dissolved under stirring 100 g of the reaction product from Example 41, 2.0 g of triethylenetetramine, and 1.0 g of dimethylsilicone. A glass cloth of a specific weight of 107 g/m² was immersed therein for impregnation and then dried in an air oven to obtain a prepreg.

Then, six sheets of the above prepregs were piled so that the thickness after curing would become about 0.8 mm. Copper foils having a thickness of 35 μm were placed on both sides of the piled prepregs and molding and curing were effected at 150° C. and 40 kg/cm² for 90 minutes using a press molding machine.

When the laminate was subjected to a combustion test in accordance with UL94 standard, self-extinction was observed within 5 seconds.

Moreover, the dielectric constant of the laminate at 1 MHz was found to be 3.4 and Tg was 185° C.

Example 43

A 3 g portion of the reaction product from Example 41 and 0.1 g of triethylenetetramine were well mixed. The mixture was heated and compressed at 280° C. and 40 kg/cm² for 90 minutes using a press molding machine and then cooled at 40° and 40 kg/cm² for 10 minutes to obtain a film. When the film was subjected to a solvent resistance test, the percent weight change was found to be 2.5%.

Example 44

Operations were conducted in the same manner as in Example 42, except that 13 g of phenoxyphosphazene oligomer represented by the following formula:

wherein n is a natural number, was used instead of dimethylsilicone to obtain a laminate consisting of six sheets of prepregs. When the laminate was subjected to a combustion test in accordance with UL94 standard, self-extinction was observed within 5 seconds.

Moreover, the dielectric constant of the laminate at 1 MHz was 3.5 and Tg was 180° C.

Example 45

In 200 g of toluene were dissolved, under stirring, 100 g of the reaction product from Example 36, 2.0 g of triethylenetetramine, and 13 g of the phenoxyphosphazene oligomer. A glass cloth with a specific weight of 107 g/m² was immersed therein for impregnation and then dried in an air oven to obtain a prepreg.

Then, six sheets of the above prepregs were piled so that the thickness after curing would become about 0.8 mm. Copper foils having a thickness of 35 μm were placed on both sides of the piled prepregs and molding and curing were effected at 150° C. and 40 kg/cm² for 90 minutes using a press molding machine.

When the laminate was subjected to a combustion test in accordance with UL94 standard, self-extinction was observed within 5 seconds.

Moreover, the dielectric constant of the laminate at 1 MHz was 3.3 and Tg was 185° C.

While the invention has been described in detail and with reference to specific examples thereof, it will be apparent to one skilled in the art that various changes and modifications can be made therein without departing from the spirit and scope thereof.

INDUSTRIAL APPLICABILITY

The invention relates to a functionalized polyphenylene ether having a large number of epoxy groups introduced into the polymer chain, which provides a polymer alloy or a blend with other resins that is excellent in mechanical properties. Further, it provides cured products that are excellent in heat resistance and dielectric property as well.

The invention claimed is:

1. A functionalized polyphenylene ether having an average of not fewer than 1.0 unit of a structure represented by the following formula (1) per molecular chain:

wherein n is an integer of 9 or more, R2 is a hydrogen atom or an organic substituent having an epoxy group, and R1 has the following formula (2):

wherein m is an integer of 0 to 10 and R3 and R4 are each an organic substituent.

2. The functionalized polyphenylene ether according to claim 1, which is obtained by reacting to a polyphenylene ester and a polyfunctional epoxy compound having two or more epoxy groups in its molecule, wherein the polyfunctional epoxy compound has the following formula (A):

wherein m is an integer of 0 to 10 and R5 and R6 are each an organic substituent.

3. The process for producing a functionalized polyphenylene ether according to claim 2, wherein the reaction is carried out at a temperature of −70 to 200° C.

4. The functionalized polyphenylene ether according to claim 2, wherein an amine compound is used as a reaction catalyst at the reaction of the polyphenylene ether and the polyfunctional epoxy compound.

5. The functionalized polyphenylene ether according to claim 1, having a weight-average molecular weight of less than 10,000.

6. A mixture comprising a functionalized polyphenylene ether having an average of not fewer than 1.0 unit of a structure represented by the following (1) per molecular chain:

(1)

wherein n is an integer of 9 or more, R1 is an organic substituent having an epoxy group, and R2 is a hydrogen atom of an organic substituent having an expoxy group, which has a weight-average molecular weight of 10,000 or more, and the functionalized polyphenylene ether according to claim 5.

7. The functionalized polyphenylene ether according to claim 1 or the mixture of the functionalized polyphenylene ethers according to claim 6, having a chlorine content of 100 ppm or less.

8. A curable resin composition comprising 0.1 to 20 parts by weight of a curing agent and 0.1 to 40 parts by weight of a phosphorus compound and/or a silicon compound, per 100 parts by weight of the functionalized polyphenylene ether according to claim 1 or the mixture of the functionalized polyphenylene ethers according to claim 6.

9. A crosslinked product of the functionalized polyphenylene ether according claim 1.

10. A composite material comprising the crosslinked product according to claim 9 and a base material.

11. A laminate comprising the composite material according to claim 10 and a metal foil.

12. A printed circuit board comprising the laminate according to claim 11.

* * * * *

UNITED STATES PATENT AND TRADEMARK OFFICE
CERTIFICATE OF CORRECTION

PATENT NO. : 7,527,863 B2 Page 1 of 1
APPLICATION NO. : 12/017915
DATED : May 5, 2009
INVENTOR(S) : Tetsuji Tokiwa It is certified that error appears in the above-identified patent and that said Letters Patent is hereby corrected as shown below:

Title Page;

On the face of the Patent, please add:

(30) Foreign Application Priority Data: --JP 2001-287540, 09/20/2001--; and

(63) Related U.S. Application Data: Continuation of application No. 10/490,347, filed on Mar. 22, 2004, now Pat. No. 7,341,783, which is a 371 of PCT/JP02/09633, 09/12/2002.

Signed and Sealed this

Twenty-third Day of June, 2009

JOHN DOLL
*Acting Director of the United States Patent and Trademark Office*